United States Patent [19]
Hart et al.

[11] Patent Number: 6,165,278
[45] Date of Patent: Dec. 26, 2000

[54] REMOVING THERMAL GREASE FROM ELECTRONIC CARDS

[75] Inventors: Paul Joseph Hart, Endicott, N.Y.; Vittorio Sirtori, Milan, Italy; Sergio Varinelli, Vedano al Lambro, Italy; Marino Verderio, Ciserano, Italy; Franco Zambon, Milan, Italy

[73] Assignee: International Business Machines Corporation, Armonk, N.Y.

[21] Appl. No.: 09/536,238

[22] Filed: Mar. 27, 2000

[51] Int. Cl.⁷ ........................................ B08B 3/04
[52] U.S. Cl. .................. 134/2; 134/22.17; 134/22.19; 134/25.4; 134/34; 134/36; 134/40; 134/42; 134/3; 134/41; 510/175; 510/245; 510/254; 510/365; 510/407
[58] Field of Search ................ 134/2, 3, 22.17, 134/22.19, 25.4, 34, 36, 40, 42, 41; 510/175, 245, 254, 407, 365

[56] References Cited

U.S. PATENT DOCUMENTS 5,190,595  3/1993  Ameen et al. .............................. 134/40

FOREIGN PATENT DOCUMENTS 0113442  7/1984  European Pat. Off. .

*Primary Examiner*—Sharidan Carrillo
*Attorney, Agent, or Firm*—Lawrence R. Fraley

[57] ABSTRACT

A method for removing thermal grease from an electronic card having plated via holes and including electronic components thereon, the method including the steps of providing a substantially water free solution having an alcohol and at least one compound of a neutral ammonium salt of an organic acid and immersing the electronic card in the solution for a predetermined period of time remove the thermal grease from the electronic card.

4 Claims, No Drawings

REMOVING THERMAL GREASE FROM ELECTRONIC CARDS

TECHNICAL FIELD

The present invention relates to a method for removing thermal grease (i.e. an organic polymer containing a thermal conductive filler) from an electronic card, particularly during rework operation.

BACKGROUND OF THE INVENTION

Some microelectronic packages, e.g. high frequency logic devices, power transistors, diodes and silicon controlled rectifiers need a controlled temperature to work properly. Usually the temperature cannot exceed a predetermined maximum (e.g. 80° C.) which may vary according to the different applications. In the manufacturing of these microelectronic packages it is common practice to inteipose a thermal conductive material, that is called usually "thermal grease", between the chip package and the heat sink, i.e. a piece of highly thermal conductive metal, in order to improve the heat transfer outside the package. The thermal grease is spread on the top of the chip package and the heat sink is then mounted and clamped on it to assure a strong mechanical contact and good heat diffusion. The thermal conductivity of grease is ensured by the presence of a conductive powder (e.g. zinc oxide). A state of the art thermal grease is the TC-208 and TC-228 produced by Thermoset Lord Chemical Products (Indiana, USA), which contains about 50–75% in weight of zinc oxide, in an organic matrix, mostly composed of polyether polyol polymers which can be fluorinated or no-fluorinated depending on the application; fluorinated compounds are the best solution when the temperature must stay below 200° C., while if the temperature should be kept under 80° C. non-fluorinated compounds are preferred.

When a package with a heat sink fails, it needs to be replaced with a new one following this procedure:

1) remove the heat sink;
2) remove the thermal grease from the top of the package;
3) apply a blow of hot air for reflowing the solder alloy connecting the package with the board;
4) rework the module.

The cleaning up of the thermal grease must be performed carefully avoiding any spreading of this product because the contamination of electrical connections, e.g. pads, circuit lines, connectors and test points may compromise the function of the electronic card causing a variation of the electric current that flows through the circuit.

Simple solvents, as for example water, alcohol or water soluble fluxes are not able to flow through the via holes during the cleaning operation and leave some thermal grease in the holes. Moreover the occlusion of the via holes by the thermal grease produces the trapping of the flux inside the holes, with possible corrosion phenomena. In fact thermal grease is not normally completely dissolved by water or alcohol and some residues may remain on the surface of the package after the package has been treated by dipping or spray techniques. For this reason, also a mechanical action (e.g. brushing) is normally needed to completely remove the thermal grease. This mechanical cleaning action is an additional burden and usually requires human intervention. Furthermore, the mechanical operations involves two problems:

1) a possible damage of the fragile components, as for instance the contacts of the connectors which could be twisted during the brushing;
2) the residues being trapped in the smallest spaces of the board, e.g. between pins and solder joints or inside via holes.

On the other hand the use of stronger solvents on the thermal grease, such as basic or acid solutions, could damage the materials of the board and of the electronic components. Therefore these chemicals cannot be used for cleaning assembled electronic cards which always present corrodible materials e.g copper, tin alloys, organic resins.

Therefore an easy chemical treatment which removes the thermal grease without the need of a subsequent mechanical action would be highly desirable.

It is an object of the present invention to provide a technique which alleviates the above drawbacks.

SUMMARY OF THE INVENTION

According to the present invention we provide a substantially water free solution for dissolving thermal grease comprising an alcohol and at least one compound selected from the family of neutral ammonium salts of organic acids.

Further, according to the present invention we provide a method for removing thermal grease from an electronic card, the electronic card having plated via holes and including electronic components, the method including the step of immersing the card in a substantially water free solution for dissolving thermal grease comprising an alcohol and at least one compound selected from the family of neutral ammonium salts of organic acids.

DETAILED DESCRIPTION OF THE PREFERRED EMBODIMENT

The solution and method according to the present invention use the principle of the dissolution of the conductive powder (e.g. zinc oxide) and of the organic matrix of the thermal grease. The electronic card is treated with a substantially water-free alcoholic solution of a neutral ammonium salt of organic acid (e.g. ammonium acetate or propionate). The ammonium salt (e.g. ammonium acetate) reacts with zinc oxide giving zinc acetate, that are soluble in alcohol, while the organic matrix (e.g. polyether polyol polymers) is dissolved by the alcohol (e.g. isopropanol).

The absence of water from the solution according to the present invention has the effect of reducing the solution surface tension. As mentioned above, some water is produced during the chemical reaction between ammonium salt and zinc oxide, but it is in a very limited quantity. The reduced surface tension of alcohol (about three times less than water) allows a better diffusion of the solution through very small holes.

A further advantage provided by the limited presence of water is to avoid the plating phenomena when two materials having different redox potentials (e.g. copper and gold) are both present on the card. These plating phenomena do not occur if an alcoholic cleaning solution according to the present invention is used, because the activity of ion copper in alcohol is much lower than in water so that the transfer of copper ions from the solution to gold is almost impossible.

According to a preferred embodiment of the present invention, the electronic card to be cleaned is dipped in the neutral alcoholic solution of ammonium salts for about 4 minutes. The temperature of the solution should preferably be around 40° C. According to a preferred embodiment, during the immersion, the solution is constantly stirred, to maximize the diffusion and the cleaning action even through the smallest holes of the electronic card and components.

According to a preferred embodiment of the present invention, the neutral ammonium salt (e.g. ammonium acetate or propionate) is added to the alcohol (e.g. isopropanol). The concentration of the neutral ammonium salt is preferably between 4 g/l and the saturation concentration (e.g. for ammonium acetate in isopropanol 16 g/l). According to a preferred embodiment of the present invention 14 g of ammonium acetate have been added to 1 liter of isopropanol. Any other alcohol or alcoholic mixture able to dissolve ammonium salts, can be used instead of isopropanol, e.g. methanol or ethanol. The neutrality of the above described solution avoids the corrosion of the materials of the electronic card.

By immersing an electronic card or component in the above described solution, the thermal grease is removed without damages to all the parts of the card. In this way a very easy and efficient cleaning of the card is realized, which completely removes the thermal grease and allow the rework of the card without even requiring a mechanical intervention.

What is claimed is:

1. A method for removing thermal grease from an electronic card having plated via holes and including electronic components thereon, said method comprising the steps of:
   providing a substantially water free solution comprising an alcohol and at least one compound of a neutral ammonium salt of an organic acid; and
   immersing said electronic card in said substantially water-free solution for a predetermined period of time to remove said thermal grease from said electronic card.

2. The method of claim 1 wherein said predetermined period of time is about 4 minutes.

3. The method of claim 1 wherein the temperature of said substantially water-free solution during said immersing of said electronic card is about 40 degrees Celsius.

4. The method of claim 1 further including constantly stirring said substantially water-free solution during said immersing of said electronic card.

* * * * *